(12) United States Patent
Jacob et al.

(10) Patent No.: US 9,093,496 B2
(45) Date of Patent: Jul. 28, 2015

(54) PROCESS FOR FACILTIATING FIN ISOLATION SCHEMES

(71) Applicants:GLOBALFOUNDRIES Inc., Grand Cayman (KY); INTERNATIONAL BUSINESS MACHINES CORPORATION, Armonk, NY (US); STMICROELECTRONICS, INC., Coppell, TX (US)

(72) Inventors: Ajey P. Jacob, Albany, NY (US); Kangguo Cheng, Schenectady, NY (US); Bruce B. Doris, Slingerlands, NY (US); Nicolas Loubet, Guilderland, NY (US); Prasanna Khare, Schenectady, NY (US); Ramachandra Divakaruni, Ossining, NY (US)

(73) Assignees: GLOBALFOUNDRIES INC., Grand Cayman (KY); INTERNATIONAL BUSINESS MACHINES CORPORATION, Armonk, NY (US); STMICROELECTRONICS, INC., Coppell, TX (US)

( * ) Notice: Subject to any disclaimer, the term of this patent is extended or adjusted under 35 U.S.C. 154(b) by 44 days.

(21) Appl. No.: 13/945,445

(22) Filed: Jul. 18, 2013

(65) Prior Publication Data
US 2015/0024572 A1 Jan. 22, 2015

(51) Int. Cl.
*H01L 21/8238* (2006.01)
*H01L 21/762* (2006.01)
(Continued)

(52) U.S. Cl.
CPC .... *H01L 21/76243* (2013.01); *H01L 21/76267* (2013.01); *H01L 21/823821* (2013.01); *H01L 21/823878* (2013.01); *H01L 21/845* (2013.01); *H01L 27/0886* (2013.01); *H01L 27/0924* (2013.01); *H01L 27/105* (2013.01);
(Continued)

(58) Field of Classification Search
CPC .................. H01L 21/02296; H01L 21/02318; H01L 21/8232; H01L 29/6681
See application file for complete search history.

(56) References Cited

U.S. PATENT DOCUMENTS 5,926,722 A 7/1999 Jang et al.
5,963,811 A 10/1999 Chern
(Continued)

OTHER PUBLICATIONS

Akarvardar et al., "Bulk FinFET with Partial Dielectric Isolation Feature a Punch-Through Stopping Layer Linder the Oxide", U.S. Appl. No. 13/927,698, filed Jun. 26, 2013.
(Continued)

*Primary Examiner* — Cheung Lee
(74) *Attorney, Agent, or Firm* — Kevin P. Radigan, Esq.; Heslin Rothenberg Farley & Mesiti P.C.

(57) ABSTRACT

Semiconductor fabrication methods are provided which include facilitating fabricating semiconductor fin structures by: providing a wafer with at least one fin extending above a substrate, the at least one fin including a first layer disposed above a second layer; mechanically stabilizing the first layer; removing at least a portion of the second layer of the fin(s) to create a void below the first layer; filling the void, at least partially, below the first layer with an isolation material to create an isolation layer within the fin(s); and proceeding with forming a fin device(s) of a first architectural type in a first fin region of the fin(s), and a fin device(s) of a second architectural type in a second fin region of the fin(s), where the first architectural type and the second architectural type are different fin device architectures.

21 Claims, 12 Drawing Sheets

(51) Int. Cl.
  *H01L 27/088* (2006.01)
  *H01L 27/105* (2006.01)
  *H01L 29/78* (2006.01)
  *H01L 21/84* (2006.01)
  *H01L 27/092* (2006.01)
  *H01L 27/12* (2006.01)
  *H01L 21/302* (2006.01)

(52) U.S. Cl.
  CPC .......... *H01L27/1211* (2013.01); *H01L 29/785* (2013.01); *H01L 21/302* (2013.01); *H01L 21/8238* (2013.01)

(56) References Cited

U.S. PATENT DOCUMENTS

| | | |
|---|---|---|
| 6,635,543 B2 | 10/2003 | Furukawa et al. |
| 7,871,873 B2 | 1/2011 | Maszara et al. |
| 8,048,723 B2 | 11/2011 | Chang et al. |
| 8,866,204 B2 | 10/2014 | Liu et al. |
| 2004/0063286 A1 | 4/2004 | Kim et al. |
| 2006/0071213 A1 | 4/2006 | Ma et al. |
| 2007/0000897 A1 | 1/2007 | Ingle et al. |
| 2007/0090443 A1* | 4/2007 | Choi et al. ............ 257/314 |
| 2007/0102834 A1 | 5/2007 | Enicks et al. |
| 2007/0249174 A1 | 10/2007 | Yang |
| 2007/0272954 A1 | 11/2007 | Chen et al. |
| 2010/0163971 A1 | 7/2010 | Hung et al. |
| 2013/0026539 A1 | 1/2013 | Tang et al. |
| 2013/0244387 A1 | 9/2013 | Cho, Jin |
| 2013/0330889 A1 | 12/2013 | Yin et al. |
| 2014/0061734 A1 | 3/2014 | Basker et al. |
| 2014/0103451 A1 | 4/2014 | Ouyang et al. |
| 2014/0124863 A1 | 5/2014 | Cheng et al. |
| 2014/0159123 A1 | 6/2014 | Cheng et al. |
| 2014/0191296 A1 | 7/2014 | Bergendahl et al. |
| 2014/0125249 A1 | 9/2014 | Peng et al. |
| 2015/0001591 A1 | 1/2015 | Akarvardar et al. |
| 2015/0021663 A1 | 1/2015 | Akarvardar et al. |
| 2015/0021690 A1 | 1/2015 | Jacob et al. |
| 2015/0021691 A1 | 1/2015 | Akarvardar et al. |
| 2015/0021709 A1 | 1/2015 | Jacob et al. |

OTHER PUBLICATIONS

Akarvardar et al., Office Action for U.S. Appl. No. 13/945,455, filed Jul. 18, 2013 (U.S. Patent Publication No. 2015/0021691 A1), dated Jan. 21, 2015 (12 pages).

Akarvardar et al., Office Action for U.S. Appl. No. 13/945,627, filed Jul. 18, 2013 (U.S. Patent Publication No. 2015/0021663 A1), dated Jul. 11, 2014 (11 pages).

Akarvardar et al., Office Action for U.S. Appl. No. 13/945,627, filed Jul. 18, 2013 (U.S. Patent Publication No. 2015/0021663 A1), dated Jan. 21, 2015 (9 pages).

Akarvardar et al., Office Action for U.S. Appl. No. 13/945,627, filed Jul. 18, 2013 (U.S. Patent Publication No. 2015/0021663 A1), dated Mar. 20, 2015 (10 pages).

Jacob et al., Office Action for U.S. Appl. No. 13/945,415, filed Jul. 18, 2013 (U.S. Patent Publication No. 2015/0021690 A1), dated Mar. 31, 2015 (10 pages).

Arkarvardar et al., Office Action for U.S. Appl. No. 13/927,698, filed Jun. 26, 2013 (U.S. Patent Publication No. 2015/0001591 A1), dated Oct. 20, 2014 (17 pages).

Arkarvardar et al., Office Action for U.S. Appl. No. 13/927,698, filed Jun. 26, 2013 (U.S. Patent Publication No. 2015/0001591 A1), dated Feb. 24, 2015 (20 pages).

Jacob et al., Office Action for U.S. Appl. No. 13/945,379, filed Jul. 18, 2013 (U.S. Patent Publication No. 2015/0021709 A1), dated May 6, 2015 (10 pages).

* cited by examiner

US 9,093,496 B2

PROCESS FOR FACILTIATING FIN ISOLATION SCHEMES

FIELD OF THE INVENTION

The present invention relates to methods of facilitating fabricating semiconductor structures such as fin devices, and more particularly to methods for providing an isolation layer within a fin to facilitate integrating multiple fin device architectures into the fin with different isolation schemes.

BACKGROUND OF THE INVENTION

Fin field-effect transistor (FinFET) devices are currently being developed to replace conventional planar metal oxide semiconductor field-effect transistors (MOSFETs) in advanced complementary metal oxide semiconductor (CMOS) technology due to their improved short-channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes, etc.

Further enhancements in fin device structures and fabrication methods therefor continue to be pursued for enhanced performance and commercial advantage.

BRIEF SUMMARY

The shortcomings of the prior art are overcome, and additional advantages are provided through the provision, in one aspect, of a method which includes facilitating fabricating semiconductor fin structures. The facilitating fabricating includes: providing a wafer with at least one fin extending above a substrate, the at least one fin including a first layer disposed above a second layer; mechanically stabilizing the first layer of the at least one fin; removing at least a portion of the second layer of the at least one fin to create a void below the first layer of the at least one fin; filling the void, at least partially, below the first layer with an isolation material to create an isolation layer within the at least one fin; and proceeding with forming at least one fin device of a first architectural type in a first fin region of the at least one fin and at least one fin device of a second architectural type in a second fin region of the at least one fin, wherein the first architectural type and the second architectural type are different fin device architectures.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
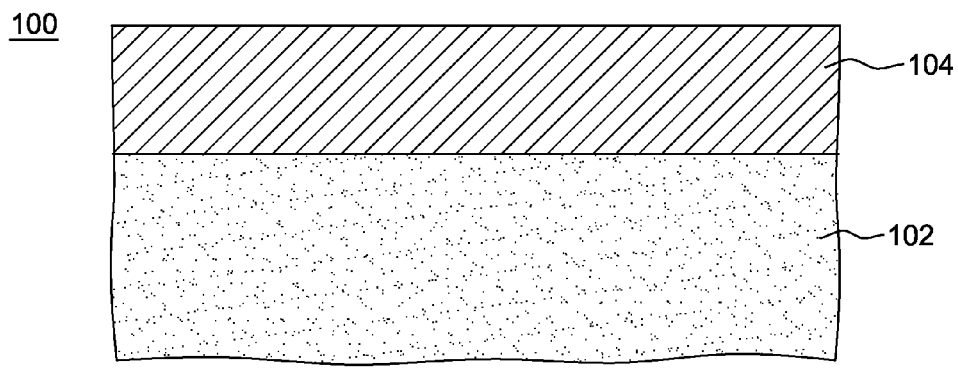
FIG. 1A depicts a partial cross-sectional elevational view of an intermediate structure, obtained during a fabrication process, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

The present disclosure provides, in part, fabrication methods for integrating multiple different fin device architectures with different isolation schemes into one or more fins. Different fin device architectures and/or fin isolation approaches may be desired for different applications. Processing methods for achieving different isolation schemes may require intermediate structures with an active layer of a fin electrically isolated from the substrate prior to subsequent processing. Challenges arise when using conventional fin fabrication processing to provide an isolation layer between such an active layer of a fin and the substrate, for instance, to facilitate integrating multiple fin device architectures with different isolation schemes without significant additional cost. By way of example, the different fin device architectures may include one or more low-leakage fin devices disposed above a fin isolation layer, integrated with one or more higher on-current fin devices with embedded stress elements such as embedded sources and drains extending through the fin isolation layer into the substrate.

Generally stated, provided herein, in one aspect, is a method for facilitating fabricating semiconductor fin structures. The facilitating fabricating includes, for instance: providing a wafer with at least one fin extending above or from a substrate, the at least one fin including a first layer disposed above or over a second layer; mechanically stabilizing the first layer of the at least one fin; removing at least a portion of the second layer of the at least one fin to create a void below the first layer of the at least one fin; filling the void, at least partially, below the first layer with an isolation material to create an isolation layer within the at least one fin; and proceeding with forming at least one fin device of a first architectural type in a first fin region and at least one fin device of a second architectural type in a second fin region, where the first architectural type and the second architectural type are different fin device architectures. For example, the first layer could be a semiconductor material, and the isolation material could be or include a dielectric material. Further, in one example, the second layer is a sacrificial layer, such as silicon germanium. As another example, removing at least a portion of the sacrificial layer of the at least one fin may include selectively etching the second layer, while filling the void below the first layer with an isolation material could include providing multiple layers of dielectric materials within the void.

In one embodiment, mechanically stabilizing the first layer of the at least one fin may include providing at least one conformal structure wrapping over at least a portion of the at least one fin and structurally facilitating support of the first layer of the at least one fin, for instance, relative to the substrate, notwithstanding creation of the void below the first layer of the at last one fin. Removing at least a portion of the second layer may include removing a portion of the second layer through an exposed portion of at least one side wall of the at least one fin. In one implementation, removing at least a portion of the second layer may include removing at least a portion of the second layer of the at least one fin underneath the at least one conformal structure. In another example, the wafer could include a shallow trench isolation layer (e.g., over the substrate) adjacent to one or more side walls of the at least one fin. In such a case, the at least one conformal structure may mechanically couple to the shallow trench isolation layer to structurally support the first layer of the at least one fin, notwithstanding creation of the void below the first layer of the at least one fin.

In one implementation, providing the wafer may include: providing a multi-layer structure which includes the substrate, the second layer disposed over the substrate, and the first layer disposed over the second layer; and removing at least a portion of the multi-layer structure to create the at least one fin. In such a case, providing the wafer may further include providing a shallow trench isolation layer, including: disposing a shallow trench isolation material over the wafer; and recessing the shallow trench isolation material to expose the first layer and at least a portion of the second layer of the at least one fin. In one example, the substrate may be or include a semiconductor substrate and providing the multi-layer structure may include: epitaxially growing the second layer over (e.g., on) the semiconductor substrate; and epitaxially growing the first layer over (e.g., on) the second layer.

In another embodiment, the method for facilitating fabricating semiconductor fin structures could further include modifying the at least one fin in a first fin region, while protecting the at least one fin in a second fin region thereof. In one implementation, protecting the second fin region could include providing a protective mask over the second fin region of the at least one fin before modifying the at least one fin in the first fin region thereof; and removing the protective mask over the second fin region subsequent to modifying the at least one fin in the first fin region thereof. By way of specific example, the at least one fin device of the first architectural type may include at least one fin transistor of the first architectural type and the at least one fin device of the second architectural type may include at least one fin transistor of the second architectural type. In such an example, the at least one fin transistor of the first architectural type in the first fin region could include at least one embedded stress element extending through the isolation layer into the substrate, and the at the least one fin transistor of the second architectural type in the second fin region could include an isolated-type fin transistor disposed above the isolation layer. For example, modifying the first fin region of the at least one fin may include forming at least one fin recess in one fin of the at least one fin within the first fin region while protecting the one fin in the second fin region of the at least one fin, wherein the at least one fin recess extends through the isolation layer to the substrate beneath the one fin. In such a case, the substrate could include a semiconductor substrate, and the proceeding could include epitaxially growing a semiconductor material from, at least in part, the semiconductor substrate through the at least one fin recess in the one fin, the epitaxially growing further providing the semiconductor material, at least partially, over the one fin in the second fin region. Furthermore, the epitaxially-grown semiconductor material could include one of silicon germanium or silicon carbon, depending, for instance, on the type of transistor being formed.

Reference is made below to the drawings, which are not drawn to scale for ease of understanding, wherein the same reference numbers used throughout different figures designate the same or similar components.

FIG. 1A illustrates a cross-sectional view of one embodiment of an intermediate multi-layer structure, generally denoted 100, obtained during fabrication of semiconductor fin structures, in accordance with one or more aspects of the present invention. As illustrated, multi-layer structure 100 includes a substrate 102, such as a bulk semiconductor material, for example, bulk silicon, and a sacrificial layer 104 formed over substrate 102. In one example, sacrificial layer 104 may be epitaxially grown or deposited over substrate 102, and may be an epitaxial single crystalline semiconductor layer. As another example, sacrificial layer 104 may be a selectively etchable material. For example, sacrificial layer 104 may include a layer of silicon germanium, which may be expressed as $Si_{1-x}Ge_x$ wherein x, the atomic ratio of germanium in silicon, may be less than or substantially equal to about 1, although the atomic ratio may be about 0.3 to about 0.7, in one example. As a specific example, the atomic ratio of germanium present in the layer of silicon germanium may be about 0.5. Silicon germanium sacrificial layer 104, may be formed (for example) by various epitaxial growth processes such as ultra-high vacuum chemical vapor deposition (UHV-CVD), low-pressure CVD (LPCVD), reduced-pressure CVD (RPCVD), rapid thermal CVD (RTCVD), or molecular beam epitaxy (MBE). In one example, the CVD-based epitaxial growth may take place at a temperature of between about 600° C. to about 1100° C., while the MBE may typically use a lower temperature. In a specific example, the selective epitaxial growth of the silicon germanium layer may be performed using halogermanes and silanes as the source gases at temperatures below 600° C. A silicon germanium sacrificial layer 104 may have a thickness of between about 1 nanometer and about 100 nanometers, depending on the metastable thickness of the $Si_{1-x}Ge_x$ layer.

Figure 1B:
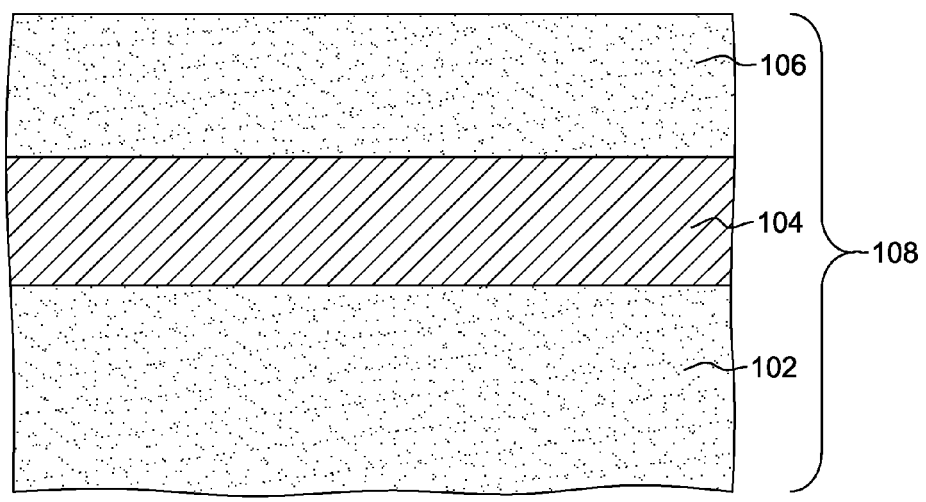
FIG. 1B depicts the intermediate structure of FIG. 1A after providing an active layer over the structure, in accordance with one or more aspects of the present invention.

FIG. 1B illustrates a cross-sectional view of the structure of FIG. 1A, with an active layer 106 shown disposed over sacrificial layer 104, creating a further multi-layer structure 108. In one example, a selective epitaxial growth process may be used to form active layer 106 over sacrificial layer 104, and a portion of active layer 106 could eventually become a channel area of, for instance, a FinFET in subsequent processing steps. In one example, active layer 106 may be the same material as substrate 102. Epitaxial growth of active layer 106 over sacrificial layer 104 may occur using processes such as CVD or MBE. In a specific example, the thickness of active layer 106 may be between, for instance, 10 nanometers and 60 nanometers, and active layer 106, such as a layer of silicon, may be grown by flowing over the multi-layer structure a reactant gas, such as dichlorosilane $SiH_2Cl_2$, trichlorosilane $SiHCl_3$, silicontetrachloride $SiCl_4$ or silane $SiH_4$ together with a carrier gas such as hydrogen gas to form a uniform silicon active layer 106.

Figure 1C:
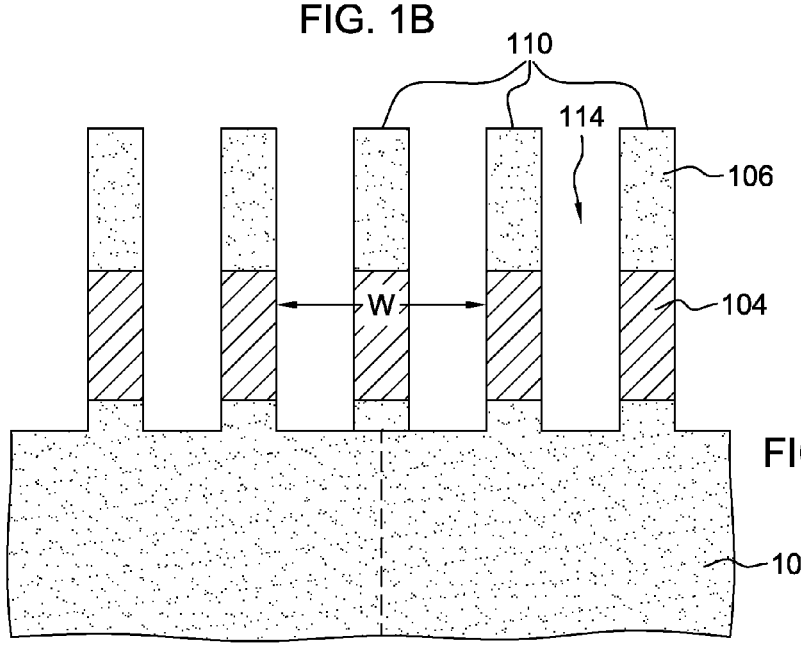
FIG. 1C depicts the intermediate structure of FIG. 1B after creating multiple fins from the multi-layer structure, in accordance with one or more aspects of the present invention.

FIG. 1C illustrates a cross-sectional view of the structure of FIG. 1B after formation of multiple fins 110, which are formed by removing, for instance, one or more portions of additional multi-layer structure 108, including a portion of active layer 106, a portion of sacrificial layer 104, and (in one embodiment) a portion of substrate 102, such that the resulting fins 110 include a portion of active layer 106, a portion of sacrificial layer 104, and (in one embodiment) a portion of substrate 102, as illustrated. By way of example, formation of fins 110 may be achieved through: patterning with various schemes, such as: direct lithography; sidewall image transfer technique; extreme ultraviolet lithography (EUV); an e-beam technique; litho-etch litho-etch; or litho-etch litho-freeze. The removal may be performed, for example, by any suitable etching process, such as an anisotropic dry etching process, for instance, reactive-ion-etching (RIE) in sulfur hexafluoride ($SF_6$). In one example, adjacent resulting fins 110 may be separated by a space 114. Although the following numbers are relative and the heights could vary, as one specific example, a fin 110 may have a silicon active layer 106 with a height of about 30 nanometers, a silicon germanium sacrificial layer 104 with a height of about 25 nanometers, and the fin portion of bulk silicon substrate 102 may be about 100 nanometers in height out of a silicon substrate that might be, for instance, approximately 600-700 micrometers thick. In another example, the overall height of fin 110 may be, for example, approximately 100 to 200 nanometers, with sacrificial layer 104 being between 10 and 20 nanometers, as one specific example. Further, the portion of bulk silicon substrate 102 may not be removed, or the portion of sacrificial layer 104 may not be fully removed.

Figure 1D:
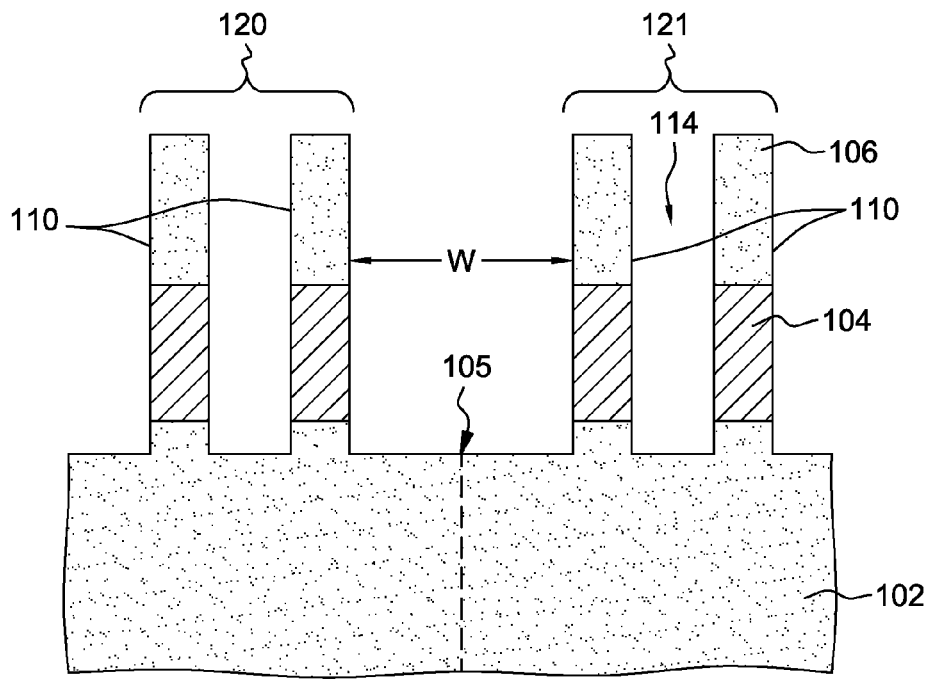
FIG. 1D depicts the intermediate structure of FIG. 1C after performing a fin cut process to remove one or more fins, in accordance with one or more aspects of the present invention.

FIG. 1D illustrates a cross-sectional elevational view of the structure of FIG. 1C after fin cut processing has been employed in a region 105 of the structure to facilitate separation of the fins into, for instance, a first array 120 and a second array 121, with a width W shown at the fin cut between fins of first array 120 and fins of second array 121 that is larger than the width of space 114 between adjacent fins within the first or second arrays. In subsequent processing of the structure, this greater width W could facilitate, for instance, deep or shallow trench isolation processing to separate the different regions of the wafer, and thus facilitate creation of different fin devices, as described herein. In one example, the first and second fin arrays or groups could be part of the same chip, supporting (for instance) a system-on-chip design.

Figure 1E:
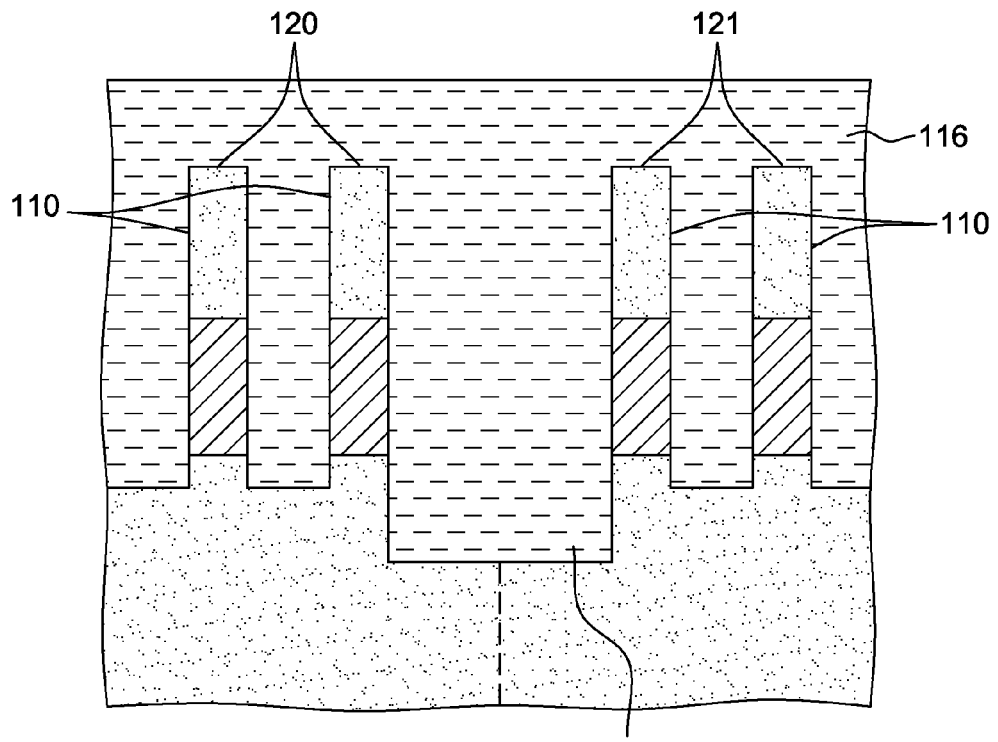
FIG. 1E depicts the intermediate structure of FIG. 1D after providing an isolation material over the structure, in accordance with one or more aspects of the present invention.

FIG. 1E illustrates a cross-sectional view of the intermediate structure of FIG. 1D after fins 110 have been surrounded or overlaid with an isolation material 116. In one example, isolation material 116 may be grown about the fins 110. In another embodiment, isolation material 116 may be deposited, for example, using a High Aspect Ratio Process (HARP). In one example, the HARP may include using an $O_3$/tetraethyl orthosilicate (TEOS) based sub-atmospheric chemical vapor deposition (SACVD) fill process which results in a deposition of silicon oxide. A HARP deposition may be advantageous as a gap-fill deposition within openings with high aspect ratios and may include both a slower deposition rate stage when a slower rate is advantageous for reducing defects, and a higher deposition rate stage when a high rate results in shorter deposition times. In another example, isolation material 116 may be a shallow-trench-isolation (STI) oxide, such as silicon dioxide, or a flowable oxide. By way of example, FIG. 1D also depicts a deep trench region 107 in the area of the fin cut, which (in one embodiment) extends parallel to the fins and serves to isolate, in part, resultant fin devices in the different fin arrays 120, 121.

Figure 1F:
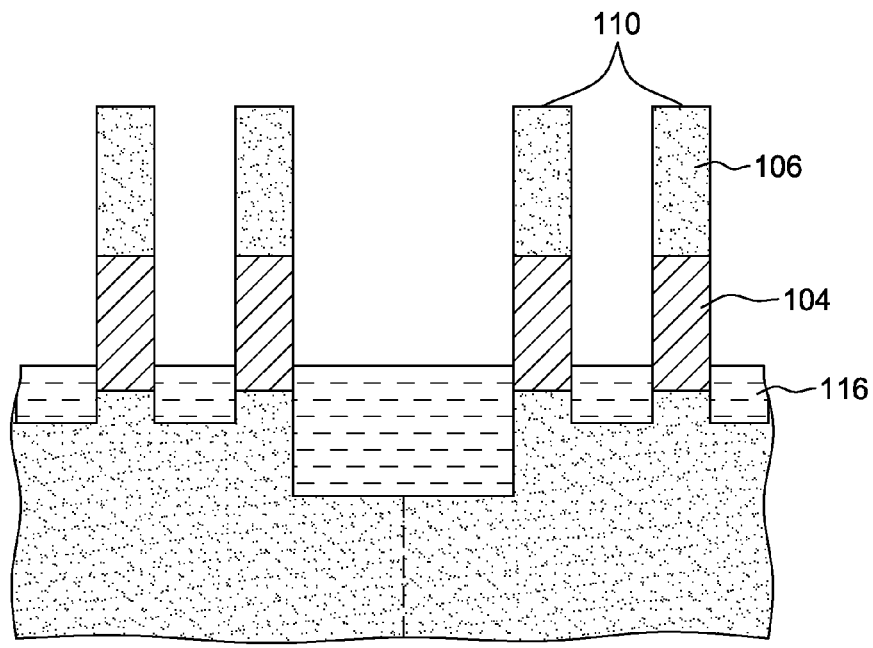
FIG. 1F depicts the intermediate structure of FIG. 1E (taken along line 1F-1F in the plan view of FIG. 1G) after recessing the overlying isolation material to reveal a portion of the fins, in accordance with one or more aspects of the present invention.

FIG. 1F illustrates the structure of FIG. 1E (taken along line 1F-1F in the plan view of FIG. 1G) after further processing to reveal one or more side walls and top surfaces of fins 110, including the side walls of active layers 106 and at least a portion of the side walls of sacrificial layers 104 of fins 110. Any suitable etching process, such as an isotropic dry etching process, for example, a SiCoNi etch process, may be employed to recess the isolation material 116 (for instance, the HARP oxide). In one specific example, a dry etching process, such as a SiCoNi etching may be employed to remove a silicon oxide isolation material 116 by using gas mixtures such as, for example, ammonia ($NH_3$) and nitrogen trifluoride ($NF_3$) in a plasma processing chamber.

Figure 1G:
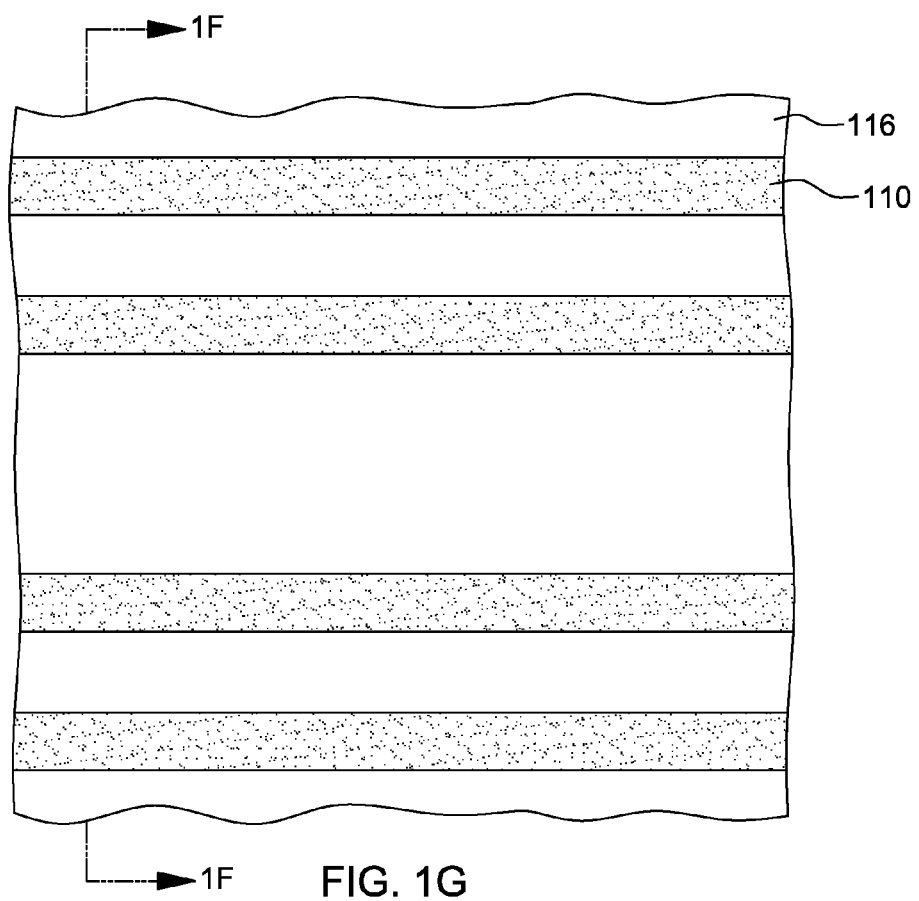
FIG. 1G depicts a plan view of the intermediate structure of FIG. 1F, illustrating the multiple parallel fins, in accordance with one or more aspects of the present invention.

As noted, FIG. 1G illustrates in plan view the intermediate structure of FIG. 1F. As depicted, multiple parallel-extending fins 110 are disposed over the illustrated portion of the substrate, and isolation material 116 partially fills the spaces or openings between the fins.

Figure 1H:
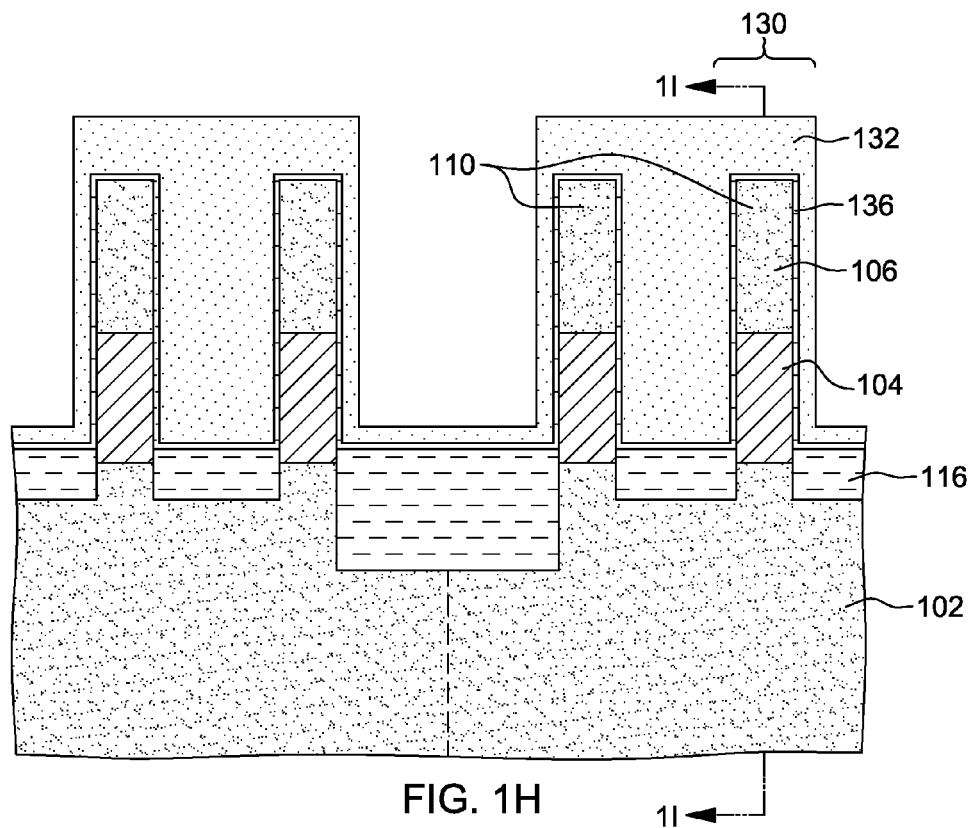
FIG. 1H depicts the intermediate structure of FIGS. 1F & 1G after gate structure formation, illustrating a single gate structure extending over multiple fins, in accordance with one or more aspects of the present invention.

FIG. 1H illustrates a cross-sectional elevational view of the intermediate structure of FIGS. 1F & 1G after gate structures 130 have been provided, extending over (in one embodiment) a portion of each depicted fin 110. These gate structures 130 are one example of conformal structures which conform to, for instance, the side walls and the top surfaces of fins 110. Further, in this example, gate structures 130 are spaced apart, and thus do not fully cover the side walls of the fins 110, and mechanically couple, in part, to the substrate through isolation layer 116. Note that this mechanical coupling or support may be other than via direct contact. The conformal structures (e.g., gate structures) operate to mechanically stabilize active layers 106 of fins 110, and allow the fins 110 to maintain structural stability, notwithstanding subsequent full or partial removal of the fins' sacrificial layers 104.

In one embodiment of gate structure 130 formation processing, and as illustrated in FIG. 1H, each gate structure 130 extends over multiple fins 110, and includes, by way of example, a gate metal 132 and a gate dielectric 136. As one example, the gate structure 130 may be a sacrificial gate structure or stack disposed across a portion of the electrically isolated top active regions of the fins, with each gate stack including one or more conformally deposited layers such as a gate dielectric layer and one or more work function layers disposed over the gate dielectric layer. Note that the various layers discussed herein may be formed from a variety of different materials using a variety of known techniques, such as, for example, atomic layer deposition (ALD) or chemical vapor deposition (CVD). The thickness of the layers may also vary, depending upon a particular application. In other examples, one or more gate structures 130 may be omitted, and other types of devices, such as passive devices (e.g., capacitors, diodes, etc.) which do not include gates, could be created using similar techniques, that is, provided there are sufficient numbers of conformal structures to provide the desired structural support of the different fins' active layers 106.

As a more specific example, the gate dielectric layer may be formed of a material such as silicon dioxide or a high-k dielectric material with a dielectric constant k greater than about 3.9 (note that k=3.9 for $SiO_2$), and may be deposited by performing a suitable deposition process, such ALD, CVD, physical vapor deposition (PVD), or the like. Examples of high-k dielectric materials which may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. As noted, one or more work-function layers may be conformally deposited over the gate dielectric layer, for example, via a deposition process such as ALD, CVD or PVD. The work-function layer(s) may include, for instance, one or more P-type metals or one or more N-type metals, depending on whether the gate structure is part of, for instance, a p-type FET (PFET) or an n-type FET (NFET). The work-function layer(s) may include an appropriate refractory metal nitride, for example, those from Groups IVa-VIa in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like. The gate material, in one example, may include polysilicon or polycrystalline silicon. In another example, the gate material may include a metal, such as, for example, tungsten (W), aluminum (Al), nickel (Ni), cobalt (Co), and titanium (Ti) and may be conformally deposited over the one or more work function layer(s) using processes, such as for instance, ALD or CVD.

Figure 1I:
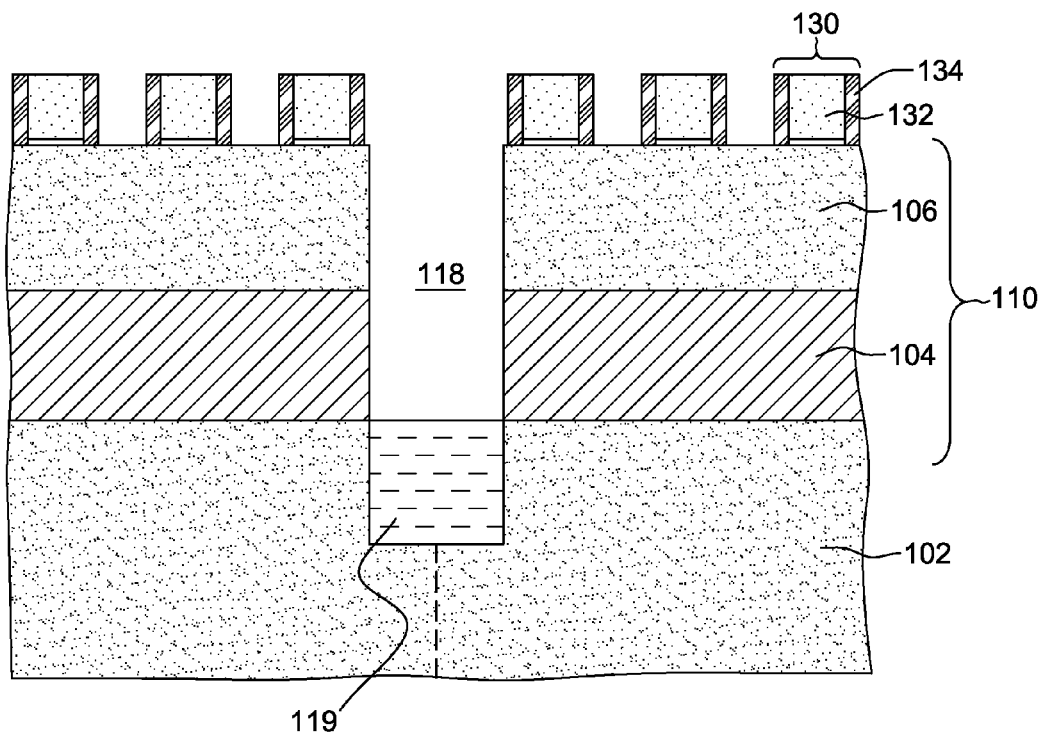
FIG. 1I depicts an elevational cross-sectional view taken through and along a single fin of the intermediate structure of FIG. 1H, along line 1I-1I thereof, and showing the single fin with multiple gate structures disposed thereon and a cut in the fin obtained from performing one type of PC cut processing, in accordance with one or more aspects of the present invention.

FIG. 1I illustrates a cross-sectional elevational view of the structure of FIG. 1H rotated 90° so as to be taken along a longitudinal axis of a single fin 110. In this illustration, PC cut processing has been performed to create a PC cut 118 in the fin, and as depicted, PC cut 118 has been partially filled with a dielectric isolation barrier 119, for instance, to facilitate electrically isolating fin devices that may be formed in subsequent processing steps. Multiple gate structures 130, with gate metals 132 and sidewall spacers 134, are shown disposed over fin 110, which includes (in one example) active layer 106, sacrificial layer 104, and (in one embodiment) a portion of substrate 102. Sidewall spacers 134 may be disposed on the sides of gate metals 132 using conventional deposition processes, such as, for example, CVD or plasma assisted CVD and the spacer material may be or include, for example, silicon nitride. In one example, the PC cut processing may precede the gate structure formation described above. For example, PC cut 118 may be created after provision of a hard mask to protect other regions of the intermediate structure, followed by providing and recessing dielectric isolation barrier 119 within the recess. In another example, PC cut processing may occur after gate structure formation.

Figure 1J:
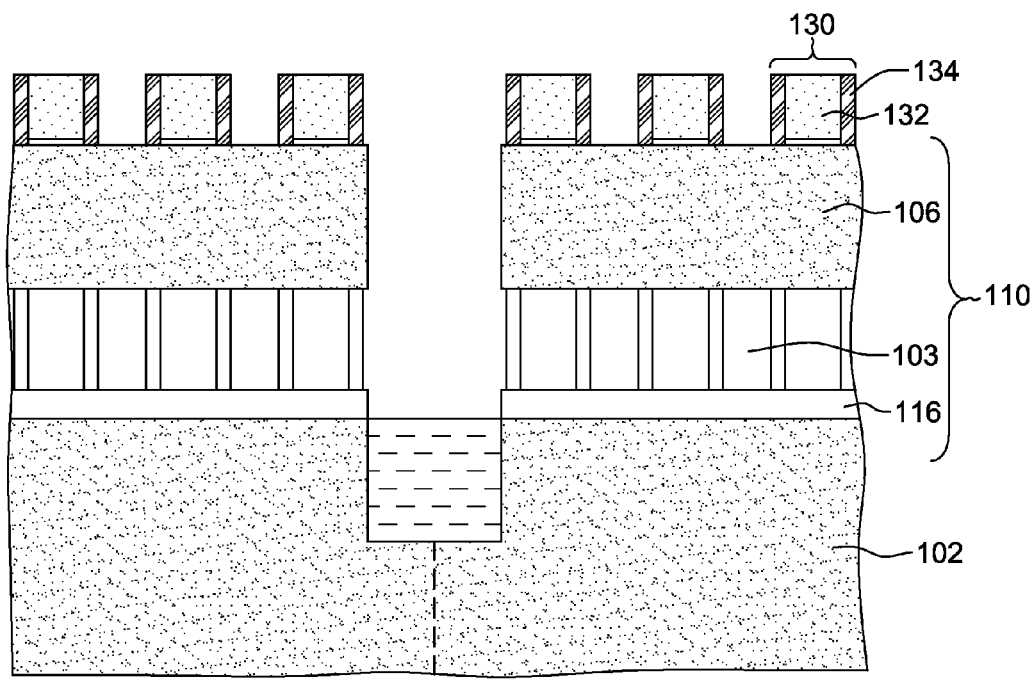
FIG. 1J depicts the intermediate structure of FIG. 1I after a sacrificial layer within the illustrated fin has been removed, creating a void therein below the upper layer, in accordance with one or more aspects of the present invention.

In FIG. 1J, at least a portion of the sacrificial layer 104 (see FIG. 1I) of fin 110 has been removed to create a void 103 below active layer 106. Note that in the depicted embodiment, the sacrificial layer has been fully removed from the fin. Removal of the sacrificial layer may be accomplished, for instance, through exposed portions of the side walls of the fin, that is, via exposed portions of the sacrificial layer side walls. Note again that gate structures 130 are conformal structures that wrap over fin 110 and structurally support active layer 106 of fin 110 relative to (for instance) substrate 102, and thereby mechanically stabilize the active layer 106 of fin 110 during and subsequent to removal of the sacrificial layer. These structures are depicted on the far side of void 103, along with a portion of the isolation material 116.

When removing at least a portion of the sacrificial layer 104 (FIG. 1I) of fin 110 to create void 103, access to the sacrificial layer will typically be constrained to mostly the exposed portions of the sacrificial layer sidewalls, as well as any recesses 118 (FIG. 1I). In view of this, a removal process is desired that operates through, for example, only the sacrificial layer sidewalls while removing sacrificial material located throughout the sacrificial layer, including material located behind or below the conformal gate structures 130. By way of example, such a removal process may be accomplished using an etchant that preferentially removes material of the sacrificial layer while not removing materials of gate structures 130, active layer 106, or substrate 102. In one example, performing a highly selective wet etching process using hydroxide-containing chemical wet etchants may be used to selectively etch a sacrificial layer including, for instance, silicon germanium, without etching metals or silicon, which may be used in gate structures 130, active layer 106, or substrate 102. Examples of an hydroxide-containing etch chemistry include tetramethylammonium hydroxide (TMAH), ammonium hydroxide ($NH_4OH$), potassium hydroxide (KOH) and lithium hydroxide (LiOH). Chlorine containing selective etchants such as HCl could also be sued. Etching could also be a function of time and temperature. For example, with this etch chemistry, it has been found that both temperatures of the etchants and higher concentrations of germanium increase the selectivity between silicon and SiGe. Hydroxide-containing etch chemistries are one example of a family of etch chemistries that may be selective to silicon germanium. Depending upon the etching process used, different etch times may be needed to achieve removal of the desired portion or the entirety of the sacrificial layer to create void 103.

Figure 1K:
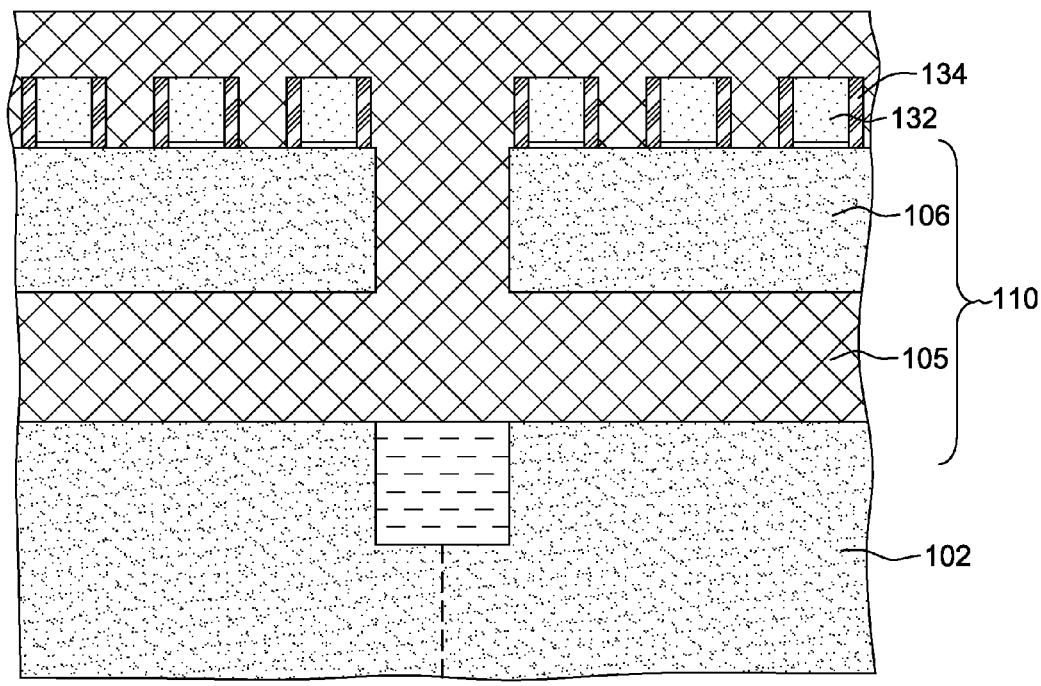
FIG. 1K depicts the intermediate structure of FIG. 1J after filling the void within the fin with an isolation material, in accordance with one or more aspects of the present invention.

FIG. 1K illustrates the structure of FIG. 1J, after void 103 (see FIG. 1J) has been filed, at least partially, below active layer 106 with an isolation material to create an isolation layer 105 within the fin 110. This isolation material/layer may be or include silicon dioxide or silicon nitride in one embodiment. In another example, more than one layers of isolation material may be introduced into the void, creating an isolation layer stack of multiple layers of, for instance, dielectric materials. Filling, at least partially, the void below active layer 106 with an isolation material to create isolation layer 105 utilizes a filling process capable of introducing the isolation material through the open side walls of fin(s) 110 to reach all portions of the void, including those located behind or below the gate structures. In one example, the filling material may include flowable oxide, such as, for example, a hydrogen silsesquioxane polymer or a carbon free silsesquioxane polymer, which may be deposited in the void by a flowable chemical vapor deposition (F-CVD). In another example, the filling material may include silicon nitride (SiN or $Si_3N_4$), silicon oxide ($SiO_2$), or fluorinated silicate glass (FSG). In another example, the filling material may be disposed by a conventional conformal deposition process, such as atomic layer deposition (ALD) of $SiO_2$ or SiN, or a combination thereof.

Figure 1L:
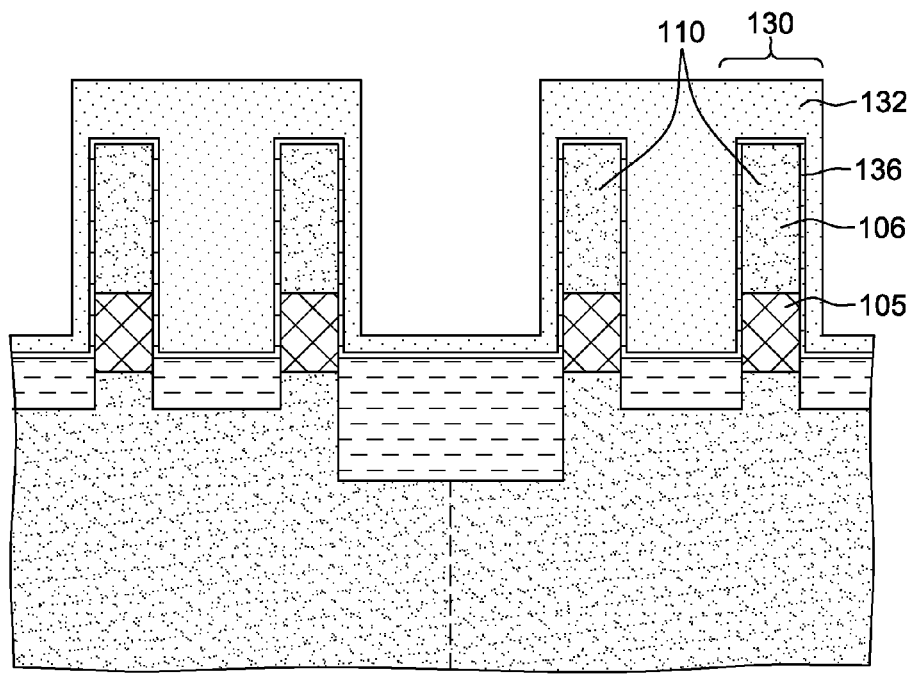
FIG. 1L depicts a cross-sectional elevational view of the intermediate structure of FIG. 1K, rotated 90° and illustrating the isolation layers within the multiple fins of the structure, in accordance with one or more aspects of the present invention.

FIG. 1L illustrates the structure of FIG. 1K, rotated 90° so as to be taken through multiple fins 110, and through a single gate structure. As depicted, the isolation layers 105 serve to separate the active layers 106 of fins 110 from substrate 102, which prepares the structure for further processing, for instance, to create multiple fin devices with different isolation schemes.

Figure 1M:
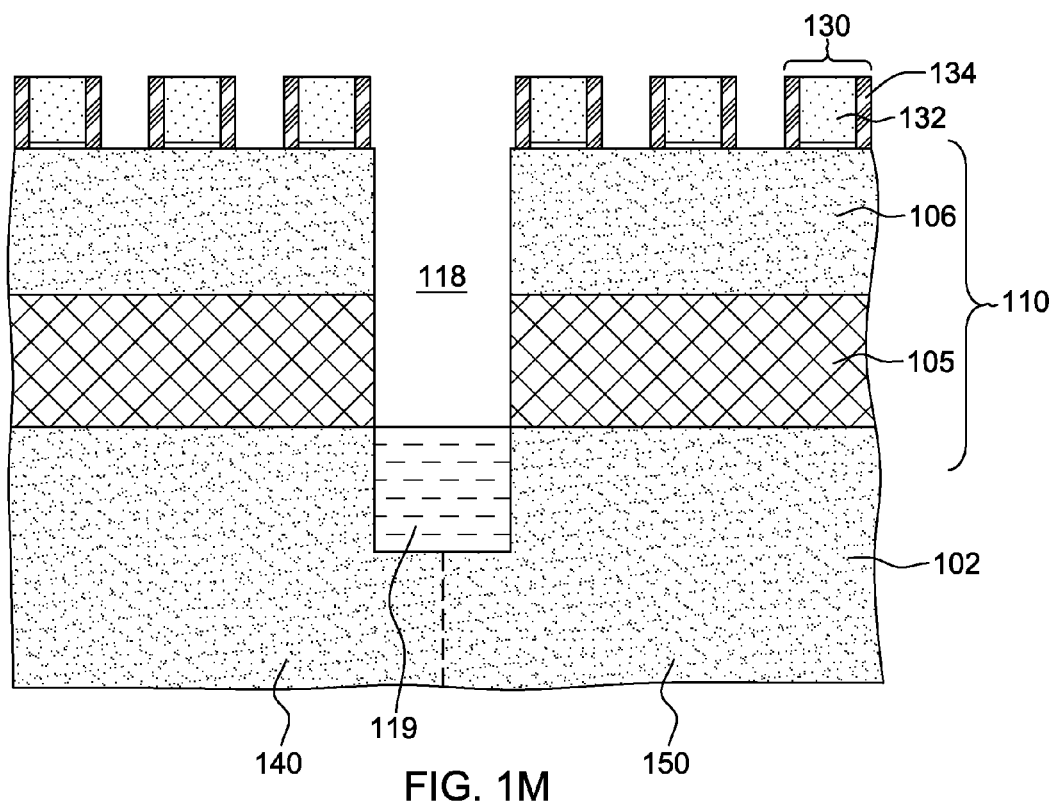
FIG. 1M depicts the intermediate structure of FIGS. 1K & 1L after recessing the isolation material, in accordance with one or more aspects of the present invention.
Figure 1N:
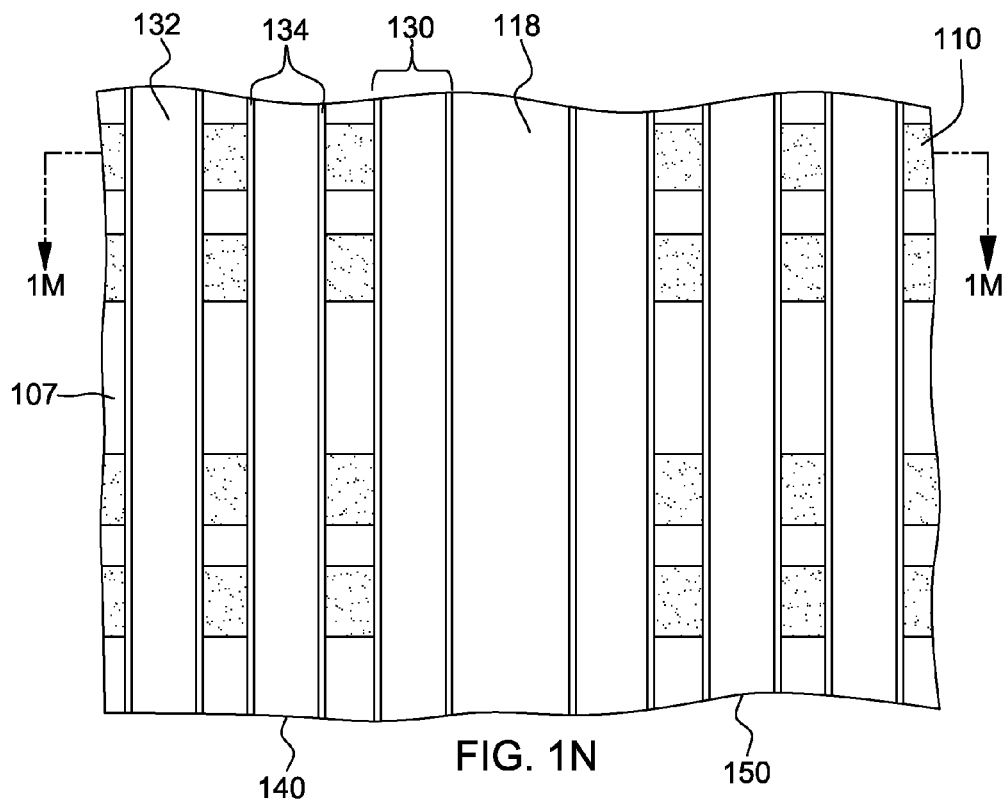
FIG. 1N depicts a plan view of the intermediate structure of FIG. 1M, illustrating multiple parallel gate structures extending over the fins, in accordance with one or more aspects of the present invention.

FIG. 1M illustrates the structure of FIG. 1K, taken along line 1M-1M in FIG. 1N, after recessing of the isolation material to (in part) expose the gate structures 130 for further processing. To recess the isolation material, in one example, anisotropic etching could be employed to ensure that only the isolation material in the PC cut 118 is removed, without removing isolation material underneath active layer 106. In the depicted example, a recess or PC cut 118 separates the illustrated fin 110 into a first fin region 140 and a second fin region 150 by, for example, providing a dielectric isolation barrier 119 extending vertically into the one or more fins 110 at the PC cut 118. In another example, the dielectric isolation barrier 119 may intersect with the isolation layer 105 therein. As one example, this dielectric isolation barrier may be an oxide barrier extending vertically into or through fin 110 to substrate 102. The presence of the dielectric isolation barrier facilitates subsequent processing to create fin devices of a first architectural type in first fin region 140, and fin devices of a second architectural type in first region 150, such as devices which are differently isolated or configured relative to isolation layer 105.

FIG. 1N depicts a plan view of the structure of FIG. 1M, and illustrates multiple fins 110 extending parallel to one another, with multiple overlying gate structures 130 extending transverse to fins 110. As noted, gate structures 130, may have a gate metal 132 and sidewall spacers 134, overlap fins 110 in selected areas to constitute, for instance, gates of multiple FinFETs formed in associated with the fins. The length of fins 110 may be (by way of example) a micron, several micrometers, or even the diameter of the entire wafer. In this figure, the transverse nature of the fin cut 107 and the PC cut 118 can be seen.

Figure 1O:
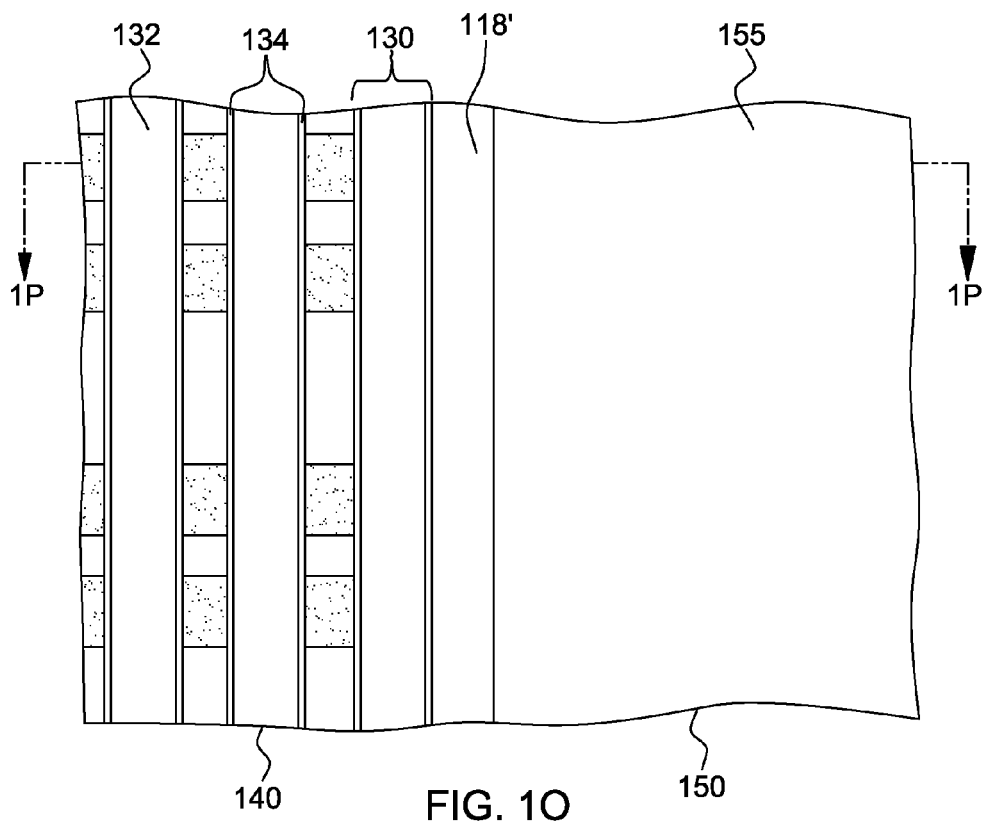
FIG. 1O depicts a plan view of the intermediate structure of FIG. 1N, wherein a first region of the structure remaining exposed, and a second region has been overlaid with a protective layer, in accordance with one or more aspects of the present invention.

FIG. 1O depicts the structure of FIG. 1N after processing, to overlay a protective layer 155, such as a protective mask, over second fin region 150. This protective layer 155 protects the structures of second fin region 150 from processing to be subsequently performed within first fin region 140. In one embodiment, protective layer 155 is, for instance, a hard mask layer conformally deposited over the structures, including the gate structures within second fin region 150 of the wafer and may include a nitride or an oxide, such as, for example, silicon nitride or silicon oxide, or an oxynitride or a combination thereof. The deposition processes may include any conventional process such as, for example, low temperature CVD, PECVD, or ALD. In one specific example, silicon nitride may be deposited using process gases such as, for example, dichlorosilane ($SiH_2Cl_2$) and ammonia ($NH_3$) and using known process conditions. In another example, where no high temperature processes are involved, ODL and FCVD masking may also be used. In a further example, a low-pressure CVD or ALD-created mask may be used to form the protective layer. In another example, other hard mask materials, such as metal oxides or metals, may be used. Note, however, that if the mask is required for selective epitaxial deposition, metals or metal oxides should not be used, as they are not entertained in the epitaxial chamber. Also, note that in the depicted embodiment, protective layer 155 partially fills the PC cut, leaving a partially exposed PC cut 118'.

Figure 1P:
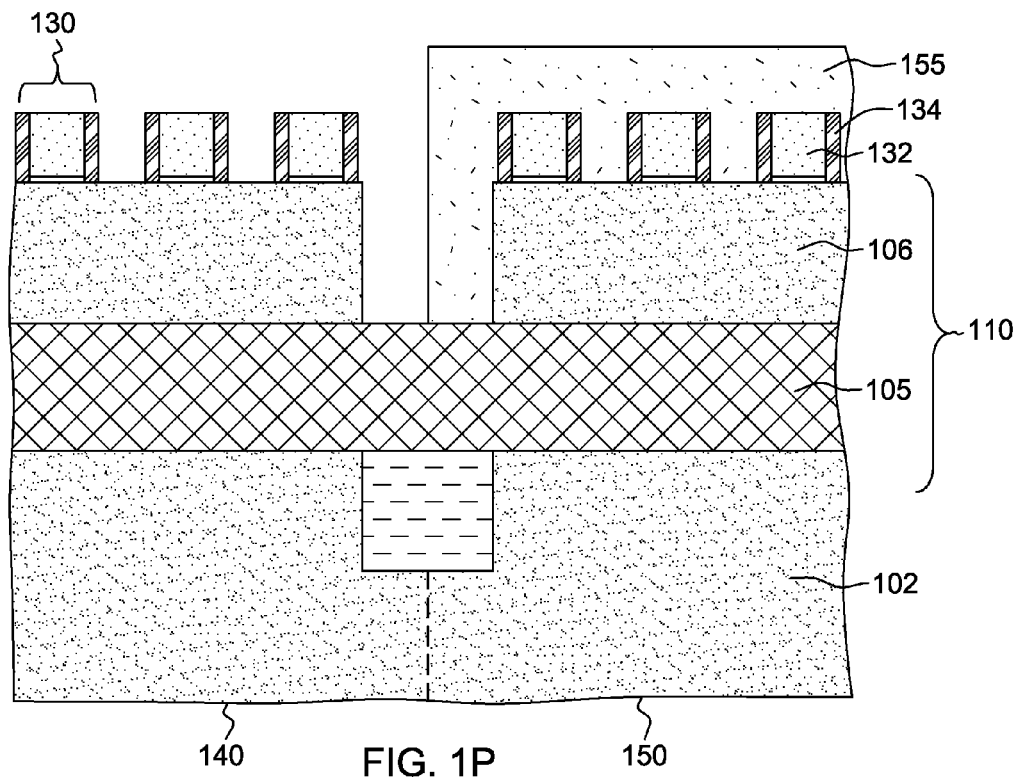
FIG. 1P depicts the intermediate of structure of FIG. 1O, taken along line 1P-1P thereof, in accordance with one or more aspects of the present invention.

FIG. 1P illustrates a cross-sectional view of the structure of FIG. 1O, taken along line 1P-1P thereof, and showing that protective layer 155 overlies the structures in the second fin region 150, and protects those structures during subsequent processing in the first region 140.

Figure 1Q:
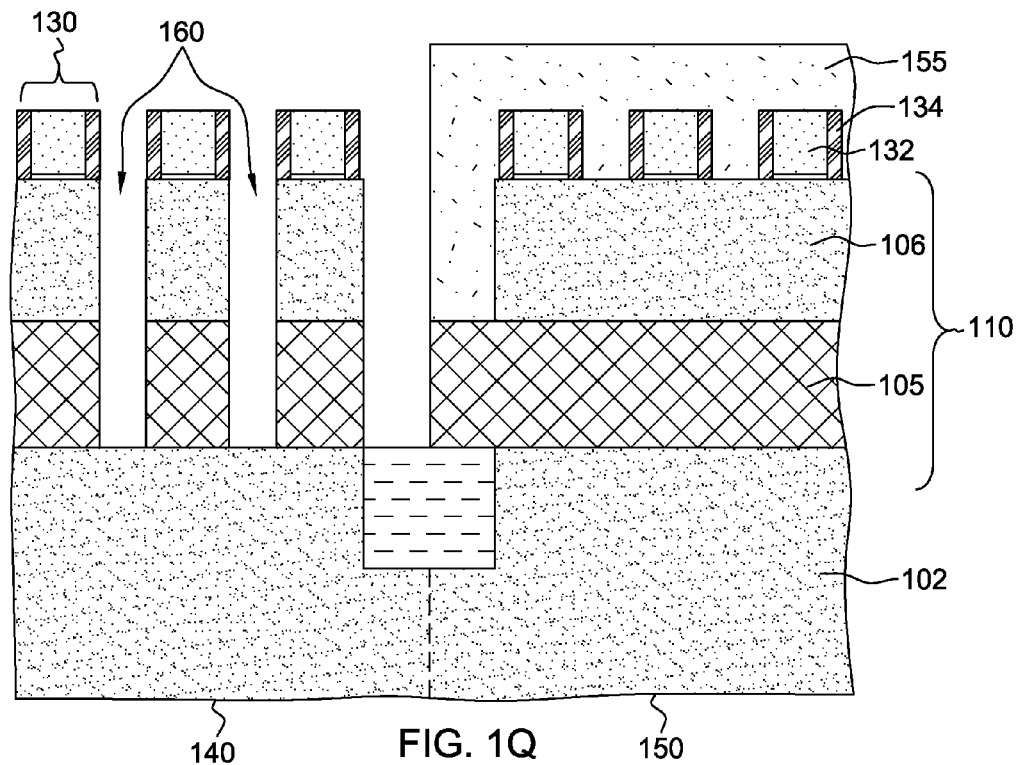
FIG. 1Q depicts the intermediate structure of FIG. 1P after formation of multiple recesses in the first region thereof extending, by way of example, through the isolation layer of the depicted fin, in accordance with one or more aspects of the present invention.

FIG. 1Q illustrates the structure of FIGS. 1O & 1P, after processing to form fin recesses 160 within fin(s) 110 in first fin region 140, with the second fin region 150 having been protected during the processing by the protective layer 155. In the depicted example, fin recesses 160 extend through isolation layer 105 within first fin region 140 and are disposed adjacent to gate structures 130. These fin recesses may be formed using any suitable etching process, such as isotropic dry or wet etching processing. In one example, isotropic dry etching may be performed via, for example, ion beam etching, plasma etching or isotropic RIE. In another example, isotropic wet etching may alternatively (or additionally) be performed using etching solutions such as, for example, HF:Nitric:Acetic acid solution (also known as HNA etch solution). Note that the example described herein with reference to FIGS. 1Q-1V is one example only of the additional processing that may be performed within the first fin region subsequent to protection of the second fin region. Further, in terms of the recess, many variations are possible. For instance, the depth of the recess could be increased such that the fin recesses 160 extend into substrate 102 or, for instance, different fin recesses may extend to different depths into the respective fin. Note also that formation of fin recesses may occur across multiple fins exposed on the wafer, that is, the first fin region may comprise multiple regions of, for example, a plurality of parallel-extending fins on the wafer.

Figure 1R:
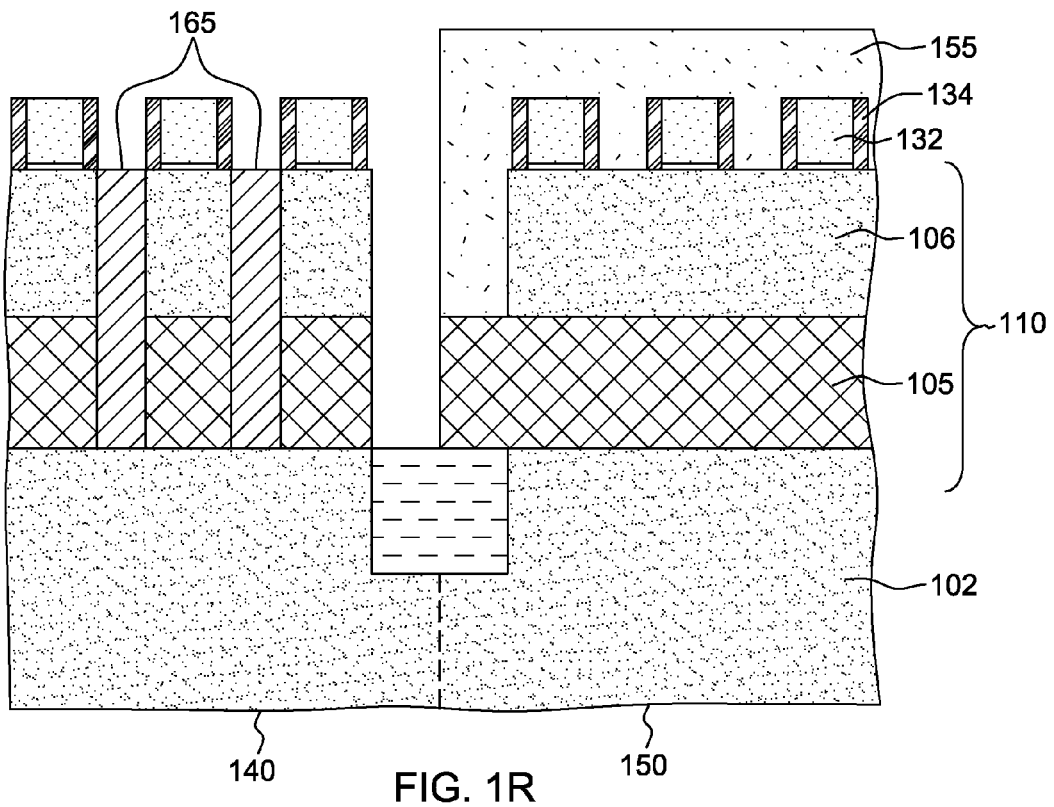
FIG. 1R depicts the intermediate structure of FIG. 1Q after filing the fin recesses in the first region thereof with a material, in accordance with one or more aspects of the present invention.

FIG. 1R illustrates the structure of FIG. 1Q after filling of fin recesses 160 in first fin region 140 with a material 165, such that, in the illustrated example, material 165 extends through isolation layer 105 in the exposed first fin region 140. In one example, the structure of FIG. 1R may be obtained by epitaxially growing a semiconductor material, at least partially, from the lower region of fin 110 or substrate 102, upwards through the fin recesses 160 (see FIG. 1Q). Material 165 may constitute a source or drain, which facilitate forming first architectural type fin devices in first fin region 140 that have embedded stress elements penetrating isolation layer 105.

In one example, the embedded stress elements (that is, material 165) are a semiconductor material, such as silicon germanium or silicon carbon. Silicon germanium could be grown in order to fabricate a p-type MOS (PMOS) structure, while silicon carbon could be grown in order to fabricate an n-type MOS (NMOS) structure. In another example, there could be multiple steps of epitaxial growth (with the use of appropriate protective layers), first growing silicon germanium, followed by growing silicon carbon, with the result being one each of a PMOS and NMOS transistor, yielding a CMOS circuit. Epitaxially growing the semiconductor material would, in one embodiment, take place starting with the substrate, because the semiconductor substrate is (in one example) a crystalline material from which epitaxial growth is possible, but in another example epitaxial growth could take place from, for instance, a portion of the side walls of fins 110, such as active layer 106. Stress-inducing materials, such as one or more tensile stress inducing materials to improve the tensile stress of an NMOS transistor or one or more compressive stress inducing materials to improve the compressive stress of a PMOS transistor, may also be epitaxially grown. In one example, the tensile stress of an NMOS transistor may be improved using tensile stress inducing materials, such as silicon doped with carbon and phosphorous Si:C(P), where the atomic percentage of carbon may be about 1 percent to about 3 percent or silicon doped with phosphorus (SiP), where the atomic percentage of phosphorus may vary, for instance, between about 0.1 percent to about 10 percent. The term "tensile stress inducing material" denotes a material layer having an intrinsic tensile stress, in which the intrinsic tensile stress produces a tensile stress in one or more adjacent materials. For instance, a tensile stress-inducing material may be a material having an intrinsic compressive stress, in which the intrinsic compressive stress produces a tensile stress in one or more adjacent materials, or a material with a larger lattice constant and volume than the adjacent material that is lattice-matched to the stress-inducing material. The tensile stress inducing materials are epitaxially grown using selective epitaxial growth via various methods, such as, for example, CVD, RPCVD, LPCVD, or other applicable methods. The selective epitaxial growth starts when at least one semiconductor source gas is injected into the reaction chamber. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas, or a $SiCl_4$ gas, or may include a carbon source gas for the growth of SiC.

In another example of processing for creating embedded stress elements, the compressive stress of a PMOS transistor may be improved using compressive stress inducing materials for the source and drain, such as, for example, silicon germanium (SiGe) where the atomic percentage of germanium may vary, for instance, between about 0.1 percent to about 10 percent, and may be epitaxially grown above the silicon (Si) fins. The term "compressive stress inducing material" denotes a material having an intrinsic compressive stress, in which the intrinsic compressive stress produces compressive stress in one or more adjacent materials. For instance, a compressive stress-inducing material may be a material having an intrinsic tensile stress, in which the intrinsic tensile stress produces a compressive stress in one or more adjacent materials, or a material with a smaller lattice constant and larger volume than the adjacent material that is lattice-matched to the stress-inducing material. The epitaxial growth may be realized using selective epitaxial growth via various methods, such as, for example, CVD, RPCVD or other applicable methods and may be initiated using a silicon germanium source gas, which may include a stoichiometric ratio of silicon source gas and the germanium source gas. The stoichiometric ratio depends on the percentage of SiGe that is being grown. In addition, the SiGe may be doped as well. The semiconductor source gas may instead be, for example, one of the more advanced gases from the family of germyl-silanes, such as $H_3GeSiH_3$, $(H_3Ge)_2SiH_2$, $(H_3Ge)_3SiH$, or $(H_3Ge)_4Si$. Note that, in another embodiment, material 165 could comprise epitaxially-grown semiconductor material which wraps around, for instance, more than one fin so as to create a multi-channel device. In another example, additional or different devices (such as passive devices) could be provided within the first fin region, depending upon the particular desired circuit design. Also, deposition of the source or drain contact material could take place after removal of the protective layer 155.

Figure 1S:
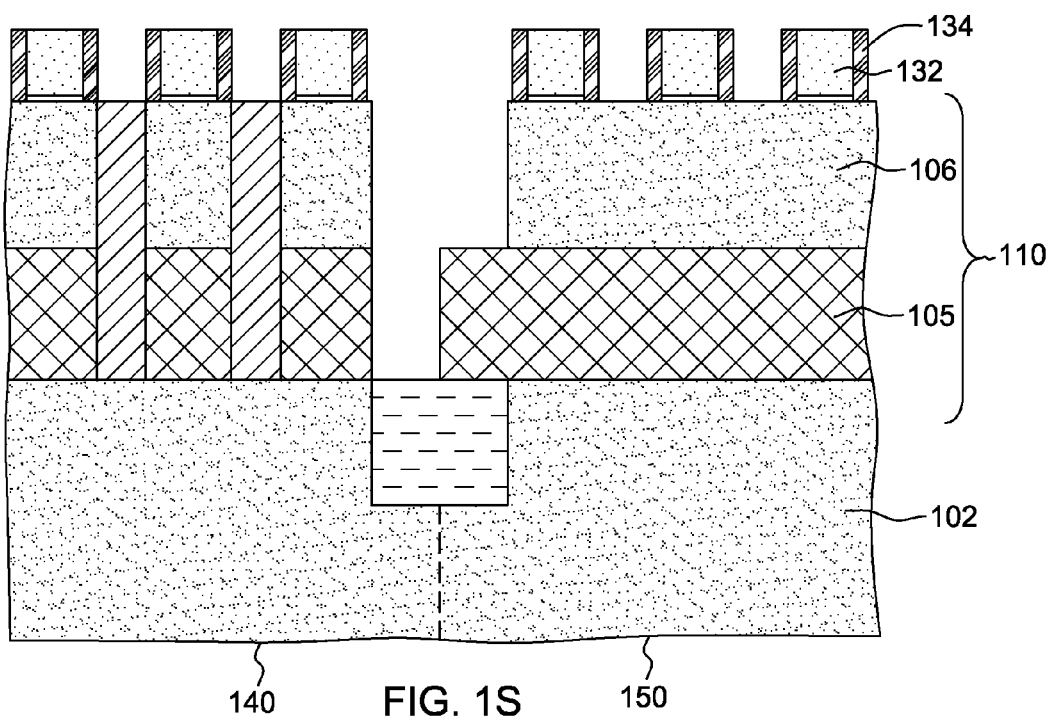
FIG. 1S depicts the intermediate structure of FIG. 1R after removal of the protective layer from over the second region thereof, in accordance with one or more aspects of the present invention.
Figure 1T:
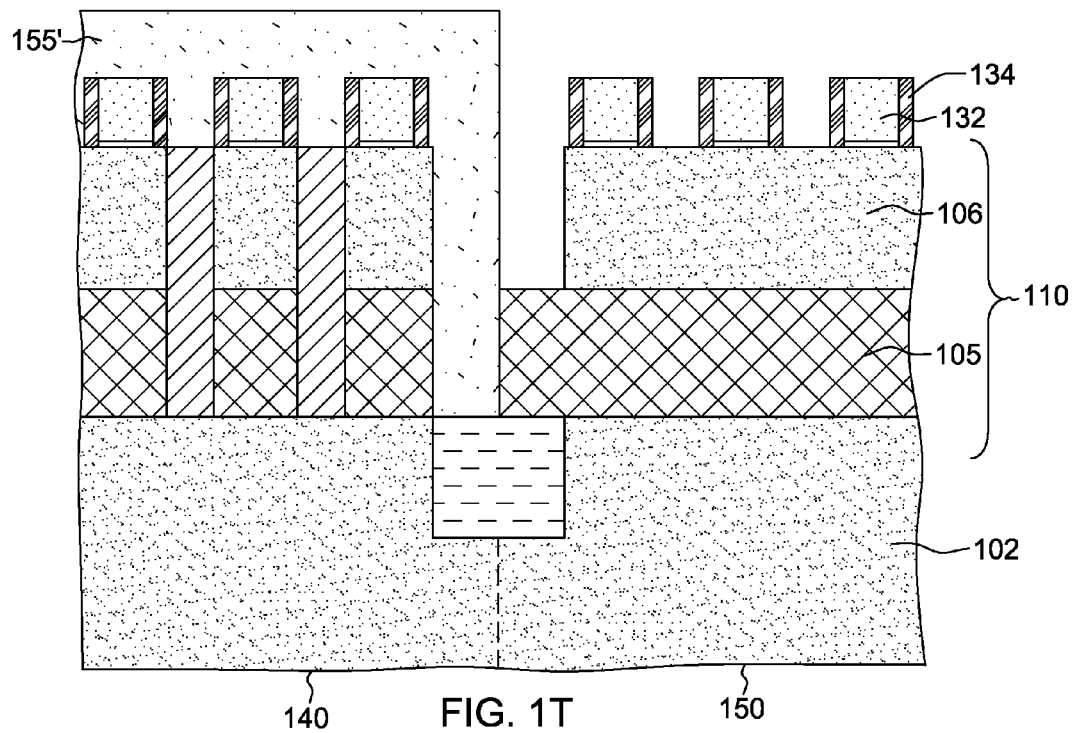
FIG. 1T depicts the intermediate structure of FIG. 1S after providing a protective layer over the first region of the structure, in accordance with one or more aspects of the present invention.
Figure 1U:
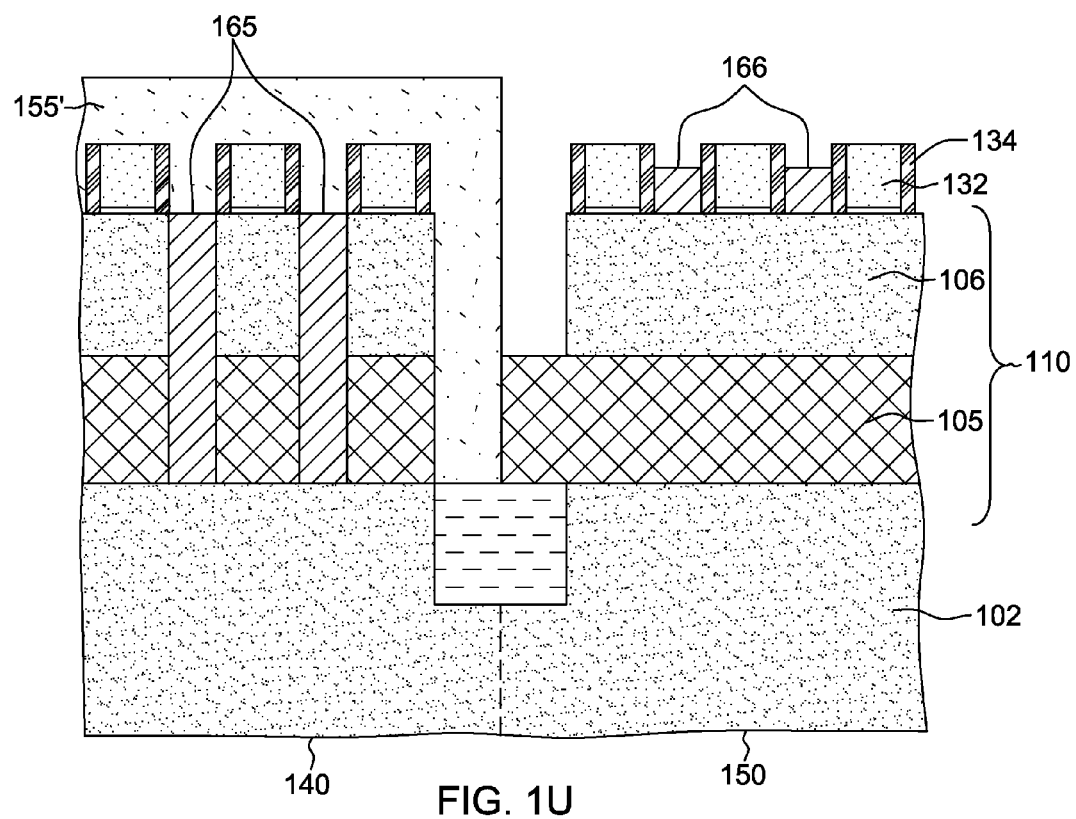
FIG. 1U depicts the intermediate structure of FIG. 1T after processing to fill the spaces between gate structures in the second region with a material, in accordance with one or more aspects of the present invention.
Figure 1V:
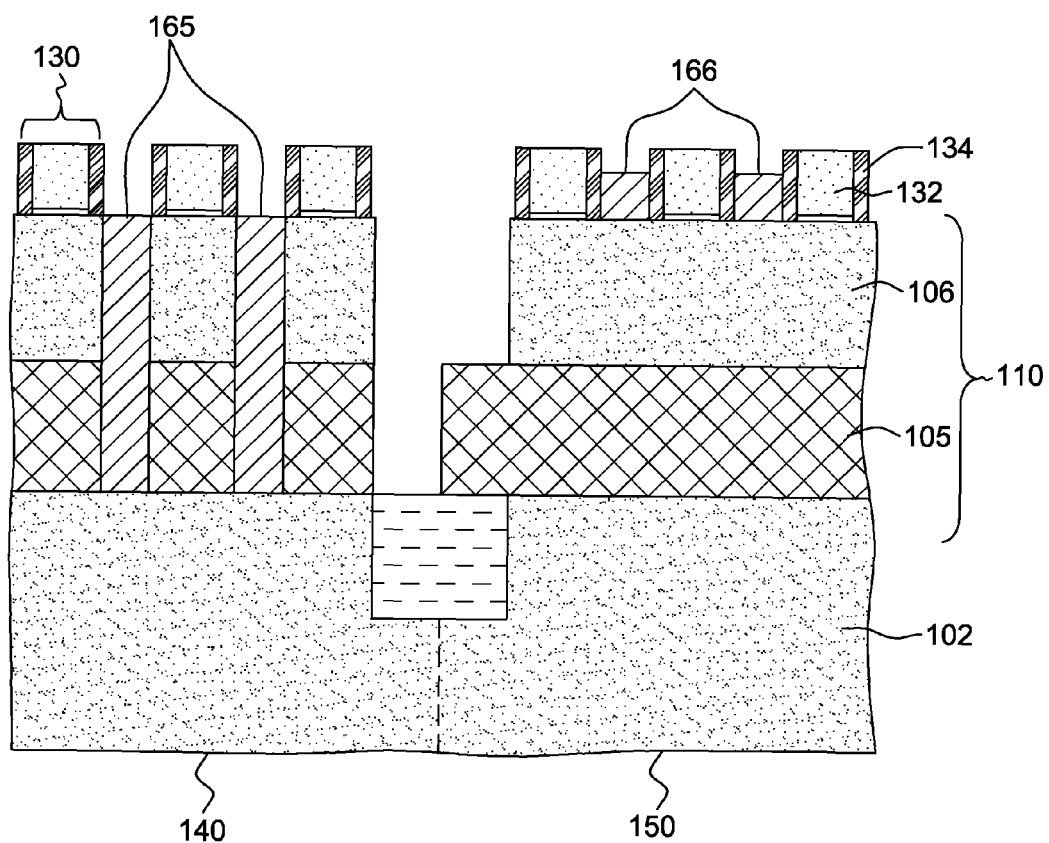
FIG. 1V depicts the intermediate structure of FIG. 1U after removing the protective layer from over the second region thereof, in accordance with one or more aspects of the present invention.

FIG. 1S depicts the intermediate structure of FIG. 1R after removal of the protective layer from second fin region 150, which exposes second fin region 150 for further processing (one example of which is depicted in FIGS. 1T-1V). The protective layer may be removed by any suitable etching process, such as anisotropic dry etching processing, for instance, RIE.

FIG. 1T illustrates the structure of FIG. 1S with a further protective layer 155' having been provided over first fin region 140 to, for instance, facilitate processing second fin region 150 on the fin 110. Additional protective layer 155' may be provided using any of the techniques described above with regard to the protective layer 155 (FIG. 1O) provided over second fin region 150. Note that, in another example, second fin region 150 may be processed simultaneously with first fin region 140, obviating the need for a second processing step using additional protective layer 155'.

FIG. 1U illustrates the structure of FIG. 1T after provision of a material 166 between gate structures 130 in the second fin region 150. This material 166, which may partially overly fin(s) 110 or may wrap around the active layer of fin 110, may be formed as a source or drain of a FinFET, resulting in or facilitating forming a second architectural type fin device(s) with second fin region 150, which lack embedded stress elements, and which may be, for instance, isolated-type fin transistors (that is, be disposed entirely above the isolation layer 105). In one example, some or all of material 165 or 166, which are source or drain elements, may be doped to form either n-type or p-type material, depending on design requirements. The doping may be done in situ, during the time of epitaxial growth or ex situ, after the epitaxial growth is completed. Ex situ doping may be performed by blanket implants, masked implants, or plasma doping.

FIG. 1V illustrates the structure of FIG. 1Q after removal of protective layer 155', using any of the techniques described above with regard to removal of the protective layer provided over second fin region 150. From this structure, first architectural type fin devices may be completed in first fin region 140, having, for example, embedded stress elements 165, and second architectural type fin devices may be completed in second fin region 150, being (for instance) isolated-type fin transistors. Both architectural type fin devices may be fin-type transistors. Note also that by using fins fabricated as disclosed herein, the different architecture type devices may incorporate different isolation schemes, such as junction-isolated, partially isolated, or fully isolated.

Figure 2:
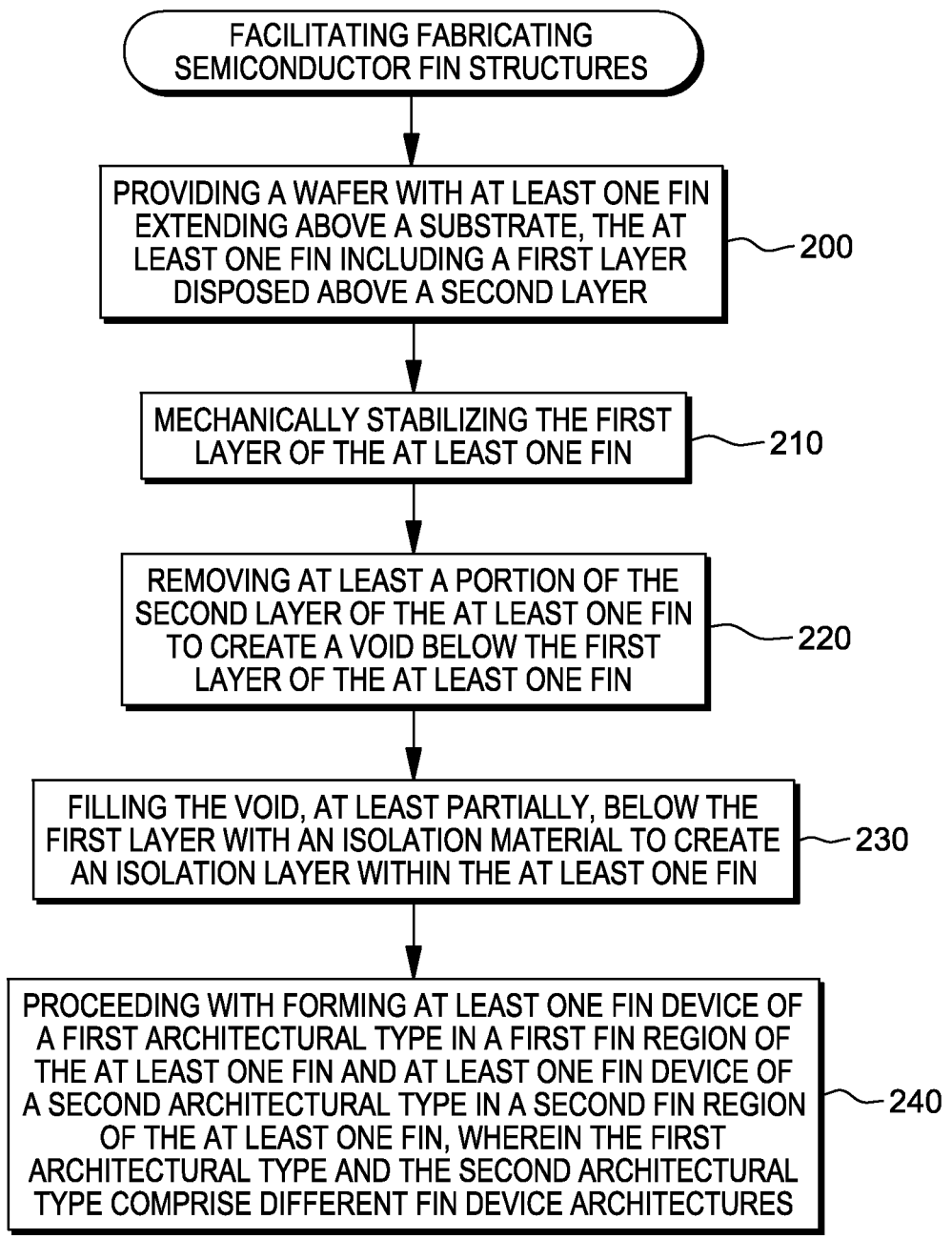
FIG. 2 depicts one embodiment of a process for facilitating fabricating semiconductor fin structures, in accordance with one or more aspects of the present invention.

By way of summary, FIG. 2 illustrates one embodiment of a process for facilitating fabricating semiconductor fin structures, in accordance with one or more aspects of the present invention. In the embodiment illustrated, the method includes, for example: providing a wafer with at least one fin extending above a substrate, the at least one fin including a first layer disposed above a second layer 200; mechanically stabilizing the first layer of the at least one fin 210; removing at least a portion of the second layer of the at least one fin to create a void below the first layer of the at least one fin 220; filling the void, at least partially, below the first layer with an isolation material to create an isolation layer within the at least one fin 230; and proceeding with forming at least one fin device of a first architectural type in a first fin region of the at least one fin and at least one fin device of a second architectural type in a second fin region of the at least one fin, wherein the first architectural type and the second architectural type are different fin device architectures 240.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
facilitating fabricating semiconductor fin structures comprising:
providing a wafer with at least one fin extending above a substrate, the at least one fin including a first layer disposed above a second layer;
mechanically stabilizing the first layer of the at least one fin;
removing at least a portion of the second layer of the at least one fin to create a void below the first layer of the at least one fin;
filling the void, at least partially, below the first layer with an isolation material to create an isolation layer within the at least one fin; and
proceeding with forming at least one fin device of a first architectural type in a first fin region of the at least one fin and at least one fin device of a second architectural type in a second fin region of the at least one fin, wherein the first architectural type and the second architectural type comprise different fin device architectures.

2. The method of claim 1, wherein mechanically stabilizing the first layer of the at least one fin comprises providing at least one conformal structure wrapping over a portion of the at least one fin and structurally facilitating support of the first layer of the at least one fin notwithstanding creation of the void below the first layer of the at least one fin.

3. The method of claim 2, wherein removing at least a portion of the second layer comprises removing a portion of the second layer through an exposed portion of at least one side wall of the at least one fin.

4. The method of claim 2, wherein the removing at least a portion of the second layer further comprises removing at least a portion of the second layer of the at least one fin under the at least one conformal structure.

5. The method of claim 2, further comprising providing a shallow trench isolation layer adjacent to a side wall of the at least one fin.

6. The method of claim 5, wherein the at least one conformal structure mechanically couples to the shallow trench isolation layer to structurally support the first layer of the at least one fin, notwithstanding creation of the void below the first layer of the at least one fin.

7. The method of claim 1, wherein providing the wafer comprises:
providing a multi-layer structure, the multi-layer structure comprising:
the substrate;
the second layer disposed over the substrate; and
the first layer disposed over the second layer; and
removing at least a portion of the multi-layer structure to create the at least one fin.

8. The method of claim 7, further comprising providing the wafer with a shallow trench isolation layer, the providing comprising:

disposing a shallow trench isolation material over the wafer; and recessing the shallow trench isolation material to expose the first layer and at least a portion of the second layer of the at least one fin.

9. The method of claim 7, wherein the substrate comprises a semiconductor substrate and providing the multi-layer structure further comprises:

epitaxially growing the second layer over the semiconductor substrate; and epitaxially growing the first layer over the second layer.

10. The method of claim 1, wherein removing at least a portion of the second layer of the at least one fin comprises selectively etching the second layer of the at least one fin.

11. The method of claim 1, wherein filling the void below the first layer with the isolation material comprises providing multiple dielectric layers within the void.

12. The method of claim 1, wherein the first layer comprises a semiconductor material, and the isolation material comprises a dielectric material.

13. The method of claim 1, wherein the second layer comprises silicon germanium.

14. The method of claim 1, wherein proceeding with forming the fin devices comprises modifying the at least one fin in the first fin region, while protecting the at least one fin in the second fin region thereof.

15. The method of claim 14, wherein the at least one fin device of the first architectural type comprises at least one fin transistor of the first architectural type and the at least one fin device of the second architectural type comprises at least one fin transistor of the second architectural type.

16. The method of claim 15, wherein the at least one fin transistor of the first architectural type in the first fin region comprises at least one embedded stress element extending through the isolation layer into the substrate, and the at the least one fin transistor of the second architectural type in the second fin region comprises an isolated-type fin transistor disposed above the isolation layer.

17. The method of claim 16, wherein modifying the first fin region of the at least one fin comprises forming at least one fin recess in one fin of the at least one fin within the first fin region while protecting the one fin in the second fin region of the at least one fin, wherein the at least one fin recess extends through the isolation layer to the substrate beneath the one fin.

18. The method of claim 17, wherein the substrate comprises a semiconductor substrate, and the proceeding comprises epitaxially growing a semiconductor material from, at least in part, the semiconductor substrate through the at least one fin recess in the one fin.

19. The method of claim 18, wherein the epitaxially-grown semiconductor material comprises one of silicon germanium, silicon carbon, or silicon germanium carbon.

20. The method of claim 18, wherein the epitaxially-grown semiconductor material comprises one of n-type or p-type material.

21. The method of claim 14, wherein protecting the second fin region comprises:

providing a protective mask over the second fin region of the at least one fin before modifying the at least one fin in the first fin region thereof; and removing the protective mask over the second fin region subsequent to modifying the at least one fin in the first fin region thereof.

* * * * *